(12) United States Patent
Visovsky et al.

(10) Patent No.: US 6,375,870 B1
(45) Date of Patent: Apr. 23, 2002

(54) REPLICATING A NANOSCALE PATTERN

(75) Inventors: Nick J. Visovsky, Corning; David D. Wang, Painted Post, both of NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/441,915

(22) Filed: Nov. 17, 1999

Related U.S. Application Data

(60) Provisional application No. 60/108,721, filed on Nov. 17, 1998.

(51) Int. Cl.$^7$ ............................................... B29D 11/00
(52) U.S. Cl. ...................... 264/1.31; 216/24; 264/1.36; 264/1.6
(58) Field of Search ............................ 492/30; 264/1.1, 264/1.21, 1.6, 2.7, 1.7, 1.36; 216/24

(56) References Cited

U.S. PATENT DOCUMENTS

| | | |
|---|---|---|
| 4,514,479 A | 4/1985 | Ferrante |
| 5,259,926 A | 11/1993 | Kuwabara et al. |
| 5,425,848 A | 6/1995 | Haisma et al. |
| 5,512,131 A | 4/1996 | Kumar et al. |
| 5,772,905 A | 6/1998 | Chou ........................ 216/44 |

FOREIGN PATENT DOCUMENTS

| | | | |
|---|---|---|---|
| GB | 260669 | * 11/1926 | ................ 264/1.31 |
| JP | 10-096808 | 4/1998 | |
| WO | WO 92/01973 | 2/1992 | |

OTHER PUBLICATIONS

Jackman et al., "Fabrication of Three–Dimensional Microstructures by Electrochemically Welding Structures Formed by Microcontact Printing on Planar and Curved Substrates," *Journal of Microelectromechanical Systems*, 7(2):261–266 (1998).

Xia et al., "Soft Lithography," *Angewandte Chemie International Edition*, 37:551–575 (1998).

"Polarimetry of Thin Metal Transmission Gratings . . . " Chen, E., Chou S.Y., *Appl. Phys. Lett.* 70 (20), May 19, 1997, pp. 2673–2675.

"Microfabrication by Microcontact Printing of Self–Assembled Monolayers" Wilbur, J.L., Kumar A., Kim, E., Whitesides, G.M., *Adv. Mater.* 1994, 6, No. 7/8, pp. 600–604.

"Imprint of Sub–25 nm vias and Trenches in Polymers," Chou, S.Y., Krauss, P.R., Renstrom, P. J., *Appl. Phys. Lett.* 67 (21), Nov. 20, 1995, pp. 3114–3116.

"Handbook of Optics" vol. II, McGraw–Hill Book Co., New York (1995), Chapter 3, pp. 3.32–3.35.

* cited by examiner

*Primary Examiner*—Mathieu D. Vargot
(74) *Attorney, Agent, or Firm*—Peter Rogalskyj; Timothy M. Schaeberle

(57) ABSTRACT

A method of replicating a nanoscale pattern which comprises forming the pattern on the outer surface of a cylindrical roller, providing a surface upon which the pattern is to be replicated, and transferring the nanoscale pattern from the cylindrical roller onto the surface to provide at least one replication of the pattern on that surface. The roller is adapted to carry the pattern on its outer surface and transfer the pattern to a substrate. The ultimate product may be a grating polarizer.

12 Claims, 6 Drawing Sheets

REPLICATING A NANOSCALE PATTERN

This Application claims benefit of Provisional No. 60/108,721 filed Nov. 17, 1998.

FIELD OF THE INVENTION

Replicating a nanoscale pattern onto a substrate from a mold, and a polarizer for UV and visible light thus produced.

BACKGROUND OF THE INVENTION

It is common practice to produce a pattern composed of depressions and/or protrusions in a mold, for example, a metal mold. The mold is then used in accordance with pressing or printing technology to reproduce the mold pattern. However, the resolution achieved with such procedure is generally limited to several microns.

Accordingly, lithography technology has been resorted to in forming patterns involving sub-micron dimensions. Such processes have been used in the production of integrated circuits and other semiconductor devices. However, the process tends to be complex, and to require expensive equipment. These problems are exacerbated where patterns involving nanometer dimensions are to be produced.

This led to the development of nanoimprint lithography for fabricating imprint patterns having nanometer dimensions. Such procedures involve producing a nanometer-scale pattern in a mold. The mold may be a rigid material, such as a metal or a dielectric. The pattern on the mold may be produced by electron beam, or x-ray lithography. The desired pattern, or a negative depending on the procedure, is then created by etching.

The procedure works well on articles having small surfaces upon which an individual, printing procedure can be employed. However, it is often desirable to print a larger, and/or repetitive, pattern on a large surface with precision. This may be a single article, such as a display panel, or a large sheet to be subdivided into a plurality of smaller articles. One area of potential application is polarizers, particularly grating polarizers for UV and visible light. Another application is production of structures used in biochemical, analysis procedures.

It is a basic purpose of the present invention to provide an improved method of producing a nanometer-scale pattern by mold imprinting.

Another purpose is to provide a method of producing a precision, nanometer-scale pattern on a large surface, such as a display panel.

A further purpose is to produce a plurality of identical, nanometer-scale patterns on a large surface.

A still further purpose is to provide a simple, inexpensive, rolling device for producing a nanometer-scale pattern by mold imprinting.

A particular purpose is to provide an improved grating polarizer for UV or visible light.

SUMMARY OF THE INVENTION

The invention resides, in part, in a method of replicating a nanoscale pattern which comprises forming the nanoscale pattern on the surface of a cylindrical roller, providing a substrate surface upon which the pattern is to be replicated, and transferring the nanoscale pattern onto the substrate surface to provide replication(s).

The invention further resides in a device for replicating a nanoscale pattern on a substrate, the device comprising a cylindrical roller carrying the nanoscale pattern on its cylindrical surface.

The invention also resides in a grating polarizer comprising a substrate having elongated, parallel lines of metal in a nanoscale pattern that are transferred to the substrate from a cylindrical roller.

BRIEF DESCRIPTION OF THE DRAWINGS

In the accompanying drawings.

DESCRIPTION OF THE INVENTION

The present invention represents the culmination of studies designed to produce an improved, grating-type polarizer. More particularly, they were designed to meet a need for a large-area polarizer for UV and visible light. While not so limited, an immediate application was a visible light polarizer of a size to match a panel in an LCD device used in television projection.

A high energy load is placed on such a panel by the intense light source employed for such projection. This dictated that the polarizer embody a transparent, inorganic material, in particular, glass. The polarizer developed to meet this need was a grating-type polarizer, also known as a wire grid polarizer. Various materials and processes have been proposed to produce such polarizers. However, they have suffered from high, production costs. They have also been limited in properties, such as the width of the wavelength band over which the polarizer is effective.

Figure 1:
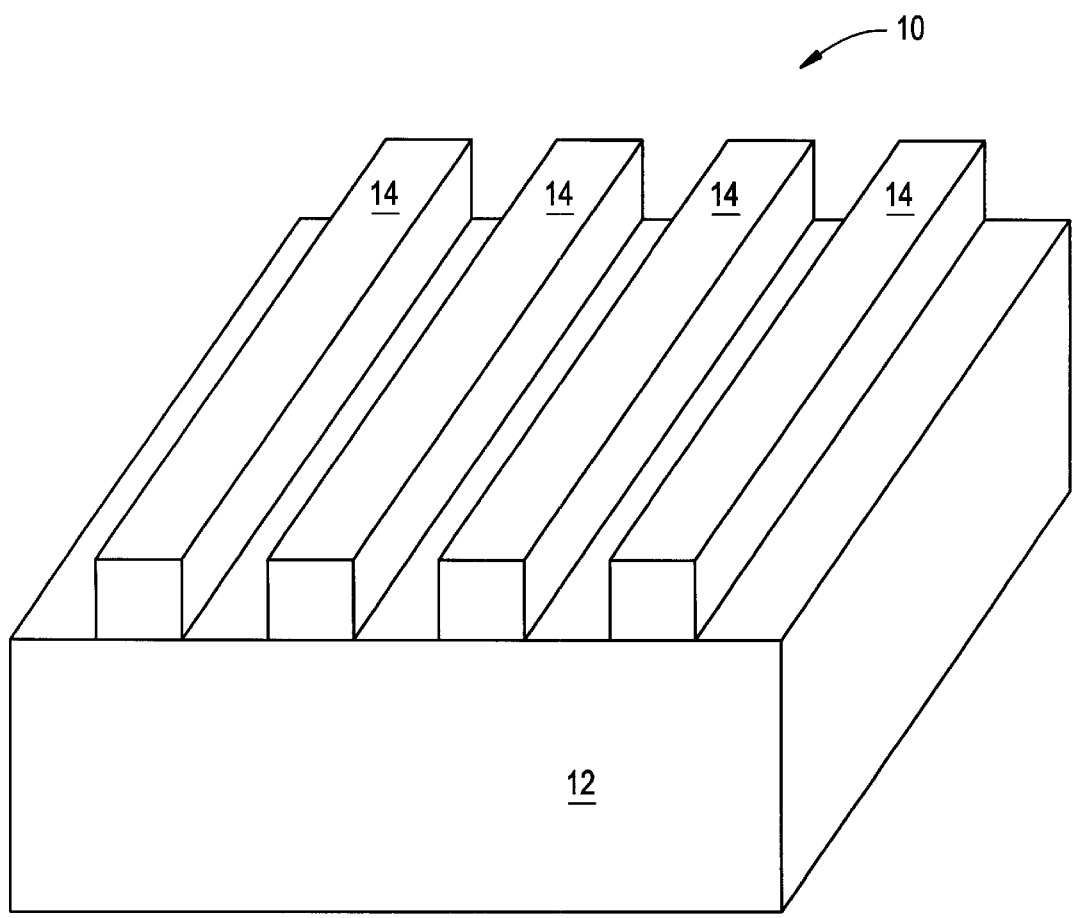
FIG. 1 is a perspective view of a grating polarizer produced in accordance with the invention.
Figure 2A:
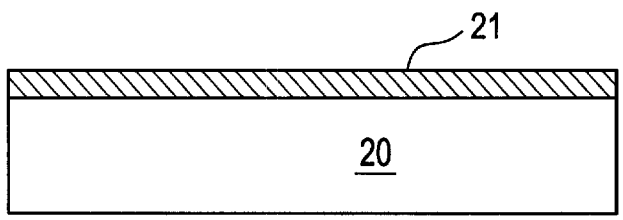
FIGS. 2A–2E illustrate, step-wise, a method of replicating a nanoscale pattern to produce the polarizer of FIG. 1.
Figure 2B:
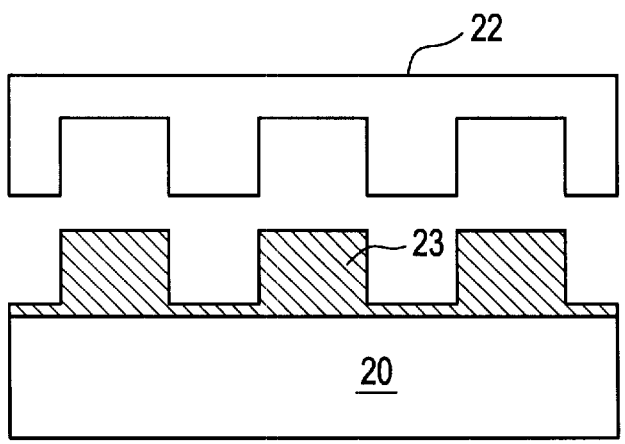
Figure 2C:
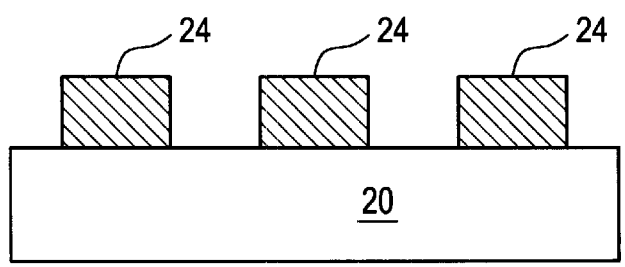
Figure 2D:
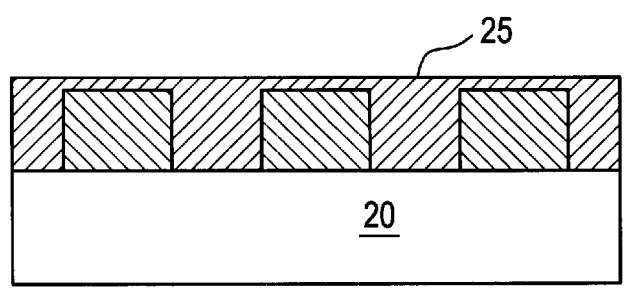
Figure 2E:
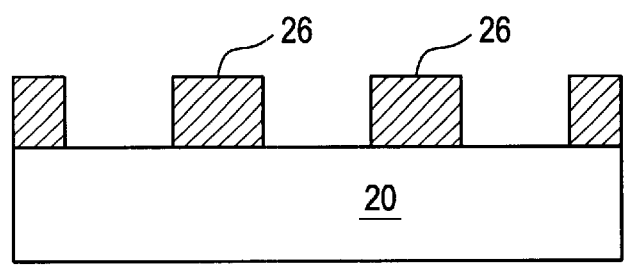
Figure 3A:
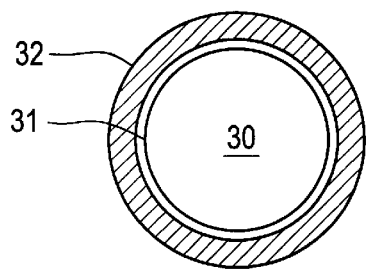
FIGS. 3A–3F, 4A–4F, 5A–5D and 6A–6D illustrate, each in a series of steps, alternative, replication methods employing a cylindrical member such as a roller or drum.
Figure 3B:
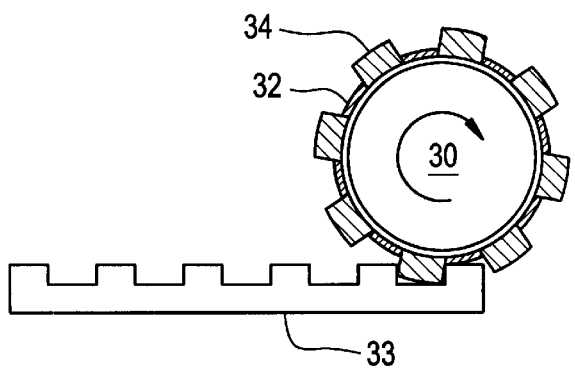
Figure 3C:
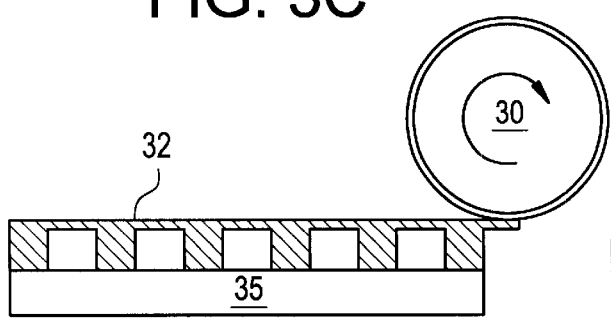
Figure 3D:
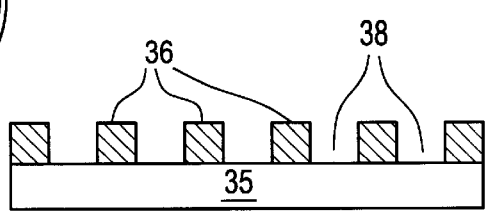
Figure 3E:
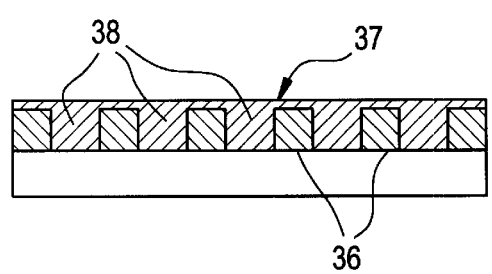
Figure 3F:
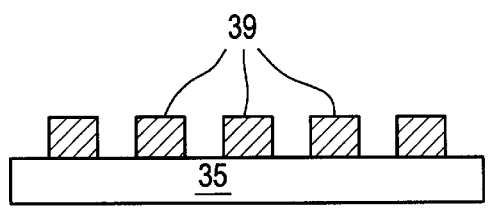
Figure 4A:
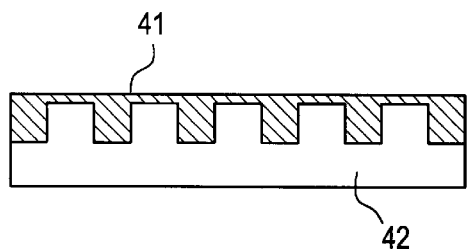
Figure 4B:
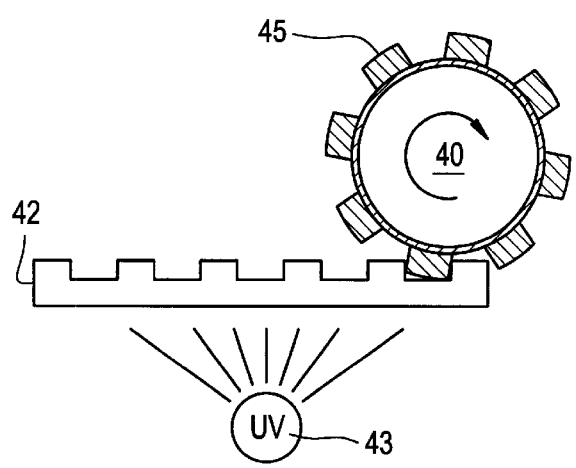
Figure 4C:
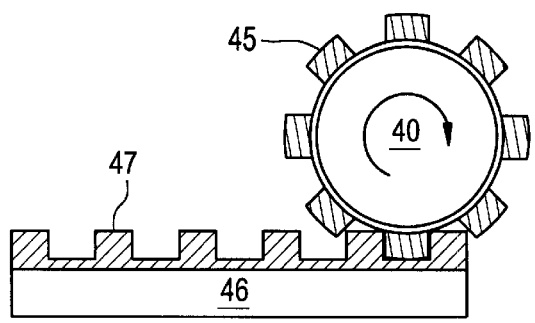
Figure 4D:
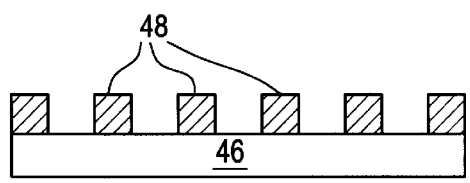
Figure 4E:
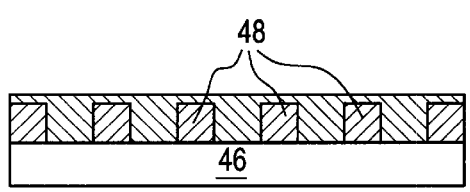
Figure 4F:
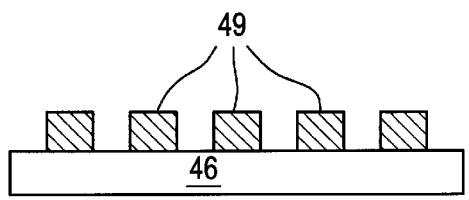
Figure 5A:
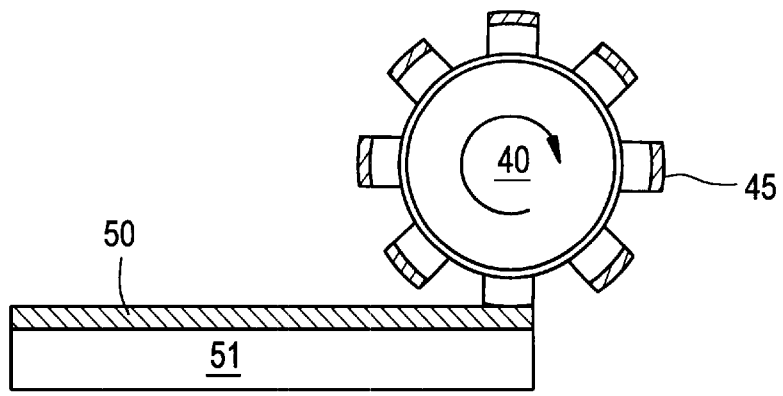
Figure 5B:
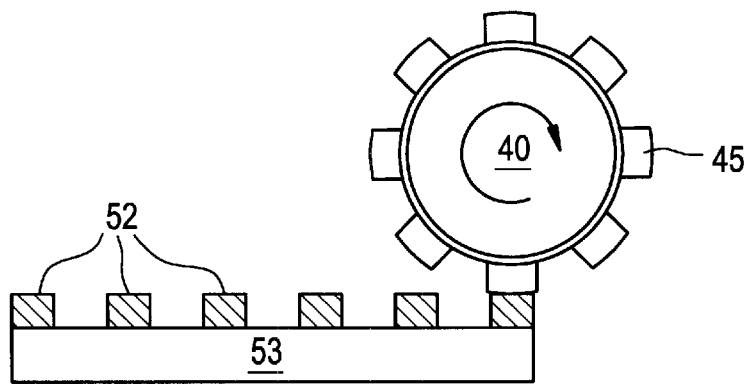
Figure 5C:
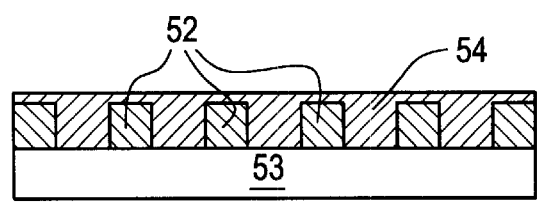
Figure 5D:
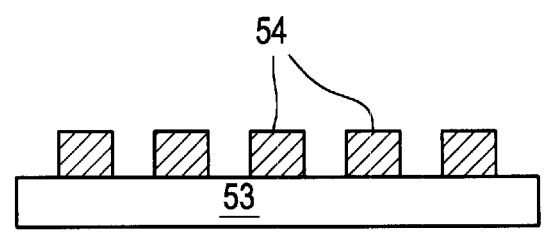
Figure 6A:
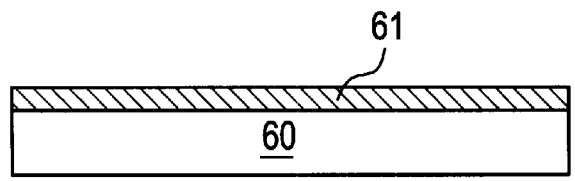
Figure 6B:
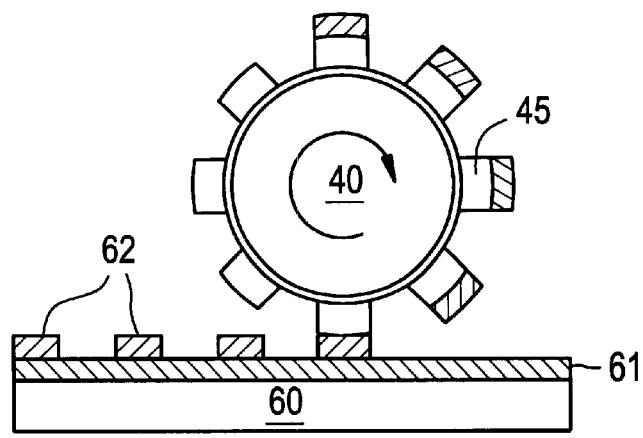
Figure 6C:
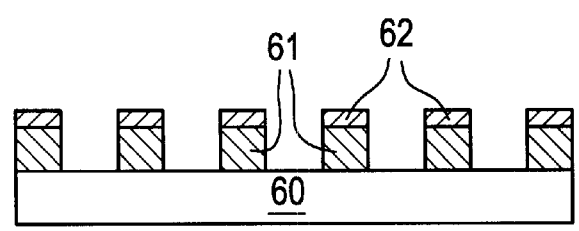
Figure 6D:
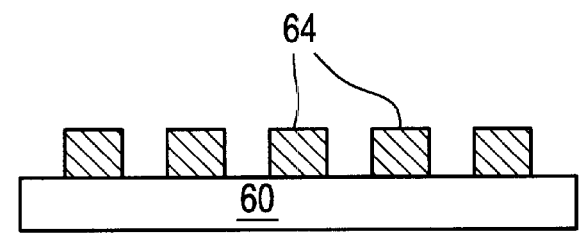

FIG. 1 is a perspective view of a typical grating polarizer designated by the numeral 10. Polarizer 10 comprises a substrate 12 produced from a suitable glass. Formed on substrate 12 are elongated, parallel, reflective metal lines 14. A particularly suited metal for lines 14 is aluminum.

There are several mathematical models and mathematical expressions that can be employed to determine polarizer performance with respect to transmission of the parallel and perpendicular electric fields of incident light. The mathematical expressions utilize the variables of the period (width and spacing) of the metallic lines, the refractive index of the transparent substrate, and the light wavelengths of interest. By using the mathematical expressions, one can design a polarizer to give adequate, polarizer performance over certain, light wavebands.

Present studies were directed to a polarizer with good contrast ratio and good transmission in the visible light waveband of 400 to 700 nm. Calculations were made using specific, mathematical expressions to determine the period of the metallic lines necessary for such a polarizer. The influence of line period on the contrast ratio of the polarizer was determined at the wavelengths of 400 nm and 700 nm with a substrate index of 1.52. High contrast ratios are obtained at shorter line periods. For example, with a 50 nm line period, the polarizer has a theoretical contrast ratio of 83:1 at the 400 nm wavelength. At the 700 nm wavelength, the theoretical contrast ratio is 256:1. A comparison of polarizer transmission versus period indicated that the highest transmission was obtained also at shorter line periods. The theoretical transmission coefficients at the 400 and 700 nm wavelengths are 0.954 and 0.966, respectively.

These contrast ratios are not very high for a single polarizer unit. However, by placing two like polarizers in series, the contrast ratios are multiplied, and theoretical contrast ratios at 400 and 700 nm would be 6889:1 and 65,536:1, respectively. The theoretical transmission coefficient of two polarizers in series would be ~0.912. A visible light polarizer with such performance characteristics would be considered very good. This performance can be improved by either using a glass with a lower index of refraction, or by coating the glass with a lower index coating (e.g., magnesium fluoride) prior to placing metal lines on the substrate.

The challenge in fabricating a grating polarizer with a period of 50 nm is the creation of metallic wires, or "lines," and spacings between the lines, with nanometer scale dimensions. For a polarizer with a 50 nm period, the line width and the spacing would each be 25 nm. Conventional, photolithography techniques are currently limited to making features as small as 500 nm. Electron beam lithography is capable of creating features in the tens of nanometers range. However, this method is quite expensive and very slow.

A new method of creating nanometer-scale features has been developed that is purportedly capable of creating features as small as 10 nm. This method is called imprint lithography. The imprint lithograph technique utilizes a mold with a designed, nanometer-scale, patterned structure. This mold can be made of metal or dielectrics. The pattern structure on the mold can be produced by electron beam lithography, or x-ray lithography, with etching to create a series of parallel lines or channels.

A mold having a nanoscale pattern produced in this manner, in combination with a deformable material, can be employed in various ways to replicate the nanoscale pattern of the mold. The deformable material may be an organic polymer applied as a coating or film, either to a flat substrate, or to a pattern mold.

FIG. 2 is a step-wise, schematic showing of a typical proceeding for replicating a nanoscale pattern in metal from a mold.

As shown in step one of FIG. 2, a flat glass substrate 20 is first coated with a polymer, thin film 21 by either spin coating or dip coating. A nanoscale mold 22, prepared as described earlier, is then pressed onto the polymer, thin film 21 to create a patterned polymer 23 having a thickness contrast as shown in step 2. During molding, heating may be required to assist the flow of polymer 21 to completely fill the channels of mold 22. Polymer film 21 is preferably a thermoplastic material that has a low, glass transition temperature. Mold 22 can first have a low, surface energy coating (not shown) deposited on it to improve its release property.

After mold 22 is released from the surface of the patterned polymer 23, that surface is subjected to anisotropic, ion etching, as shown in step 3. The glass substrate at the troughs of the polymer pattern 23 is exposed by etching, since the polymer coating is much thinner in these areas. This produces spaced polymer grids 24.

After etching, aluminum metal is deposited in the spacing channels between polymer grids 24 by sputtering, or evaporative deposition, as shown in step 4. A thin layer of aluminum may be deposited to some extent atop the polymer grids. This is removed by the procedure commonly referred to as liftoff. Final step 5 involves the lift-off of aluminum metal and removal of polymer grids 24. Polymer grids 24 are removed by using a chemical solvent. This leaves parallel, aluminum metal lines 26 with proper width and separation on glass substrate 20.

The method illustrated in FIG. 2 is effective for small-area polarizers where development of a single pattern suffices. However, it is less effective for larger areas where the pattern must be repeated. Repetitive processing can be time consuming. Also, if accurate registry is required over a large area, the process may be less than satisfactory.

To avoid this situation, the present invention has devised a replicating procedure based on use of a patterned, cylindrical roller, or drum.

FIG. 3 is a schematic, step-wise illustration of a replicating procedure utilizing a cylindrical printing drum generally designated 30. The surface of printing drum 30 is first coated with a release coating 31. Then, a thin layer of polymer resist 32 is applied over release coating 31 as shown in step 1. Drum 30 is then pressed onto, and rolled across, a pattern mold 33 to create a thickness contrast pattern 34 in polymer resist 32 as shown in step 2 of FIG. 3. The thickness contrast pattern 34 is created in polymer film 32 on printing drum 30. The patterned layer of polymer film 32 is later transferred to a glass substrate 35 as shown in step 3. With a proper design of surface energies of the release coatings of both mold 33 and printing drum 30, the transfer of the patterned, polymer film 32 between the different surfaces can be easily achieved.

Anisotropic, ion etching is then used to remove a thin section of the polymer film 32 to create a polymer, grid structure 36 on the glass substrate 35 as shown in step 4. Aluminum metal 37 is then deposited in sufficient amount to fill the intervening channels 38 as shown in step 5. The polymer grid structure 36, and any aluminum atop that structure, are then removed as described above with reference to step 5 of FIG. 2. This leaves parallel, aluminum lines 39 of proper width and separation on the surface of substrate 35 as shown in step 6.

FIG. 4 is a schematic, step-wise illustration of an alternative, replicating procedure utilizing a cylindrical printing drum 40. This procedure involves applying a layer of UV-curable polymer 41 to a rigid, glass mold 42 as shown in step 1 to pattern the polymer. Drum 40 is then pressed onto, and rolled across, mold 42 as shown in step 2. At the same time, UV light 43 is applied from the back side 44 of the mold 42 to cure and solidify the patterned polymer 41. As the surface of the printing drum 40 separates from the mold 42, the embossed, polymer pattern 41 is transferred onto the printing drum 40 to effectively create a mold 45 on the exterior of drum 40. This patterned mold polymer 45 can be used directly, or modified by depositing a release coating on it. Following this, a glass substrate 46 is coated with a polymer. The printing drum 40 with the embossed, polymer mold 45 is then pressed onto, and rolled across, it to create a patterned, polymer layer 47 on the glass substrate 46 as shown in step 3. Patterned, polymer layer 47 is then etched sufficiently to remove the thin, polymer sections in the pattern channels, leaving a polymer grid 48 as shown in step 4. Aluminum is now deposited as described with respect to FIG. 3 and shown in step 5. Any aluminum atop the polymer, and the polymer, are then removed, as described above. This leaves parallel, aluminum lines 49 on glass substrate 45 as shown in step 6.

Another, alternative procedure for replicating a nanopattern, that utilizes a cylindrical printing roll, is illustrated in the step-wise, schematic illustration of FIG. 5.

This procedure involves using patterned, printing drum 40,45, created as described in FIG. 4. First, a thin layer of polymer resist 50 (with thickness in the order of 100 nm) is applied to a glass substrate 51. Drum 40,45 is then brought in contact with, and rolled across, the polymer resist. The raised tips on drum 40,45 will pick up part of the polymer resist 50, thereby creating a polymer pattern 52. Drum 40,45 is then rolled across a second glass substrate 53 to transfer the polymer pattern 52 onto the glass substrate 53 as shown in step 2. Aluminum metal is then deposited, as described above, in sufficient amount to cover polymer pattern 52 and fill the intervening channels as shown in step 3. The aluminum atop polymer pattern 52, and the polymer pattern, are then removed by lift-off and chemically, respectively, as described previously. This leaves parallel, spaced lines 54 as shown in step 4.

A further procedure for replicating a nanopattern, utilizing a cylindrical printing roll, is illustrated in the step-wise, schematic illustration of FIG. 6.

This procedure involves using the patterned printing drum 40,45 created as described above. A glass substrate 60 is first coated with a thin layer of aluminum 61 as shown in step 1. A thin layer of alkanethiolates ($HS(CH_2)_nR$, or fluorosurfactants 62, such as Zonyl RP (Dupont Product), is applied to the pattern 45 on printing drum 40. The printing drum 40 is pressed onto aluminum layer 61 to transfer the organic coating pattern 62 to the aluminum surface as shown in step 2. The surface, thus pattern-coated, is then exposed to a reactive ion, chlorine, etching gas to etch away aluminum that is not protected by the organic coating. This exposes the underneath, glass substrate 60. The aluminum, protected by the organic coating, is preserved to form a metal grid structure coated with organic, as shown in step 3. Final step 4 involves the use of oxygen plasma to remove the organic coating. This leaves parallel, spaced, aluminum lines 64 on the surface of glass substrate 60.

We claim:

1. A method of producing a metal nanoscale pattern on a glass substrate which comprises:
    providing a patterned nanoscale mold;
    providing a cylindrical roller having a deformable coating on the surface thereof;
    using the patterned mold to form the pattern in the deformable coating on the outer surface of the cylindrical roller, thereby producing a patterned coating;
    providing a glass substrate upon which the pattern is to be replicated;
    transferring the patterned coating from the cylindrical roller onto the glass substrate; and
    using the patterned coating transferred from the cylindrical roller to the glass substrate to create a corresponding metal pattern on the glass substrate.

2. A method in accordance with claim 1, wherein the cylindrical roller having a deformable coating on the surface thereof is provided by applying a deformable coating over the outer surface of the cylindrical roller and wherein the patterned coating is formed in the deformable coating by rotating the cylindrical roller having a deformable coating on the surface thereof over the patterned nanoscale mold.

3. A method of producing a metal nanoscale pattern on a glass substrate which comprises:
    providing a patterned nanoscale mold having a patterned surface;
    applying a first deformable coating over the patterned surface of the nanoscale mold to form a patterned layer;
    providing a cylindrical roller having an outer surface;
    rotating the cylindrical roller across the patterned layer to transfer the patterned layer from the nanoscale mold to the outer surface of the cylindrical roller, thereby forming a patterned cylindrical roller;
    providing a glass substrate having a second deformable coating deposited thereon;
    using the patterned cylindrical roller to form a pattern in the second deformable coating, thereby producing a glass substrate having a patterned coating thereon and;
    using the glass substrate having a patterned coating, thereon to create a corresponding metal pattern on the glass substrate.

4. A method of producing a metal nanoscale pattern on a glass substrate which method comprises:
    providing a cylindrical roller having a nanoscale pattern on the surface thereof, the nanoscale pattern comprising tips;
    providing a substrate surface having a deformable coating thereon;
    rotating the cylindrical roller over the deformable coating to transfer the deformable coating to the tips of the cylindrical roller's nanoscale pattern;
    providing a glass substrate;
    transferring the deformable coating from the tips of the cylindrical roller's nanoscale pattern to the glass substrate, thereby producing a glass substrate having a patterned coating thereon; and
    using the glass substrate having a patterned coating thereon to create a corresponding metal pattern on the glass substrate.

5. A method in accordance with claim 1, wherein the patterned coating transferred from the cylindrical roller to the glass substrate comprises raised pattern elements separated by spacing channels; and wherein the corresponding metal pattern is created on the glass substrate by depositing metal over the patterned coating transferred from the cylindrical roller to the glass substrate in sufficient amount to fill the spacing channels and to form a thin, permeable film over the raised pattern elements.

6. A method in accordance with claim 1, wherein the patterned coating transferred from the cylindrical roller to the glass substrate comprises raised pattern elements separated by spacing channels; wherein the corresponding metal pattern is created on the glass substrate by depositing metal over the patterned coating transferred from the cylindrical roller to the glass substrate in sufficient amount to fill the spacing channels and to form a thin, permeable film over the raised pattern elements and subsequently dissolving the patterned coating transferred from the cylindrical roller to the glass substrate, thereby causing the thin, permeable film over the raised pattern elements to break away leaving a corresponding metal pattern on the glass substrate.

7. A method of producing a metal nanoscale pattern on a glass substrate which method comprises:
    providing a cylindrical roller having a nanoscale pattern on the surface thereof, the nanoscale pattern comprising tips;
    applying a soluble organic material over the tips of the cylindrical roller's nanoscale pattern;
    providing a glass substrate having a metal film deposited thereon;
    transferring the soluble organic material from the tips of the cylindrical roller's nanoscale pattern to the metal film to form a pattern of protected metal elements;
    removing unprotected metal intermediate the protected metal elements; and
    removing the soluble organic coating to leave a metal nanoscale pattern on the glass substrate.

8. A method according to claim 3, further comprising curing and solidifying the patterned layer transferred from the nanoscale mold to the outer surface of the cylindrical roller prior to using the patterned cylindrical roller to form a pattern in the second deformable coating.

9. A method according to claim 3, wherein the patterned coating on the glass substrate comprises raised pattern elements separated by spacing channels; and wherein the corresponding metal pattern is created on the glass substrate by depositing metal over the patterned coating on the glass substrate in sufficient amount to fill the spacing channels and to form a thin, permeable film over the raised pattern elements.

10. A method according to claim 3, wherein the patterned coating on the glass substrate comprises raised pattern elements separated by spacing channels; and wherein the corresponding metal pattern is created on the glass substrate by depositing metal over the patterned coating on the glass substrate in sufficient amount to fill the spacing channels and to form a thin, permeable film over the raised pattern elements and subsequently dissolving patterned coating on the glass substrate, thereby causing the thin, permeable film over the raised pattern elements to break away leaving a corresponding metal pattern on the glass substrate.

11. A method according to claim 4, wherein the patterned coating on the glass substrate comprises raised pattern elements separated by spacing channels; and wherein the corresponding metal pattern is created on the glass substrate by depositing metal over the patterned coating on the glass substrate in sufficient amount to fill the spacing channels and to form a thin, permeable film over the raised pattern elements.

12. A method according to claim 4, wherein the patterned coating on the glass substrate comprises raised pattern elements separated by spacing channels; and wherein the corresponding metal pattern is created on the glass substrate by depositing metal over the patterned coating on the glass substrate in sufficient amount to fill the spacing channels and to form a thin, permeable film over the raised pattern elements and subsequently dissolving patterned coating on the glass substrate, thereby causing the thin, permeable film over the raised pattern elements to break away leaving a corresponding metal pattern on the glass substrate.

* * * * *